US005659157A

United States Patent [19]

Shulte

[11] Patent Number: 5,659,157

[45] Date of Patent: Aug. 19, 1997

[54] 7TH ORDER ACOUSTIC SPEAKER

[76] Inventor: Daniel W. Shulte, 2448 Lemar St., Santa Rosa, Calif. 95401

[21] Appl. No.: 407,639

[22] Filed: Mar. 21, 1995

[51] Int. Cl.[6] ........................................ H05K 5/00

[52] U.S. Cl. ........................................ 181/156; 181/199

[58] Field of Search ........................................ 181/156, 199, 181/144, 145, 146, 148, 151

[56] References Cited

U.S. PATENT DOCUMENTS

| | | |
|---|---|---|
| 3,072,212 | 1/1963 | Chapman . |
| 4,398,619 | 8/1983 | Daniel . |
| 5,025,885 | 6/1991 | Froeschle . |
| 5,092,424 | 3/1992 | Schreiber et al. . |
| 5,147,986 | 9/1992 | Cockrum et al. . |
| 5,471,019 | 11/1995 | Maire ........................ 181/156 |

*Primary Examiner*—Khanh Dang
*Attorney, Agent, or Firm*—Cowan, Liebowitz & Latman, P.C.

[57] ABSTRACT

A loudspeaker system has specific exterior dimensions and specific interior dimensional correlations which has at least a first electroacoustical transducer having a vibratable diaphragm for converting an input electrical signal into a corresponding acoustic output signal. A speaker enclosure is divided into at least first, second and third subchambers by at least first and second dividing walls. The first dividing wall supports and coacts with the first electrical transducer to bound the first and second subchambers. At least a first passive radiator intercouples the first and third subchambers. At least a second passive radiator intercouples at least one of the second and third subchambers with the region outside the enclosure. Each passive radiator is characterized by acoustic mass, and each subchamber is characterized by acoustic compliance. The acoustic mass and acoustic compliances coact to establish at least three spaced frequencies in the passband of the loudspeaker system at which the deflection characteristic of the vibratable diaphragm as a function of frequency has a minimum value.

11 Claims, 5 Drawing Sheets

7TH ORDER ACOUSTIC SPEAKER

FIELD OF THE INVENTION

The present invention relates to loud speaker systems which have multiple subchambers and passive radiators, such as ports and drone cones. These systems comprise an acoustic source so coupled to a series of higher order acoustic filters as to produce an acoustic output which is frequency band limited and whose acoustic power output in that band is generally constant as a function of frequency. The series of acoustic filters are typically embodied as acoustic compliances (enclosed volumes of air) and acoustic masses (passive radiators or ports).

BACKGROUND OF THE INVENTION

Schreiber et al., U.S. Pat. No. 5,092,424, the teachings of which are incorporated herein by reference, describes a specific speaker configuration which has the following advantages:

1. Relatively low average cone excursion in the bandpass region, i.e., relatively low distortion for large signal output for a given transducer size.

2. Relatively high output in this bandpass region for a given enclosure volume.

3. The use of common, practical, economically configured transducers as the drive units.

4. Relatively higher order rolloff of high frequencies.

5. Achievement of the bandpass characteristic without external electrical elements, resulting in relatively low cost, relatively high performance and relatively high reliability.

6. A transient response which is delaying in time by up to or greater than 10 milliseconds.

Schreiber et al. teach that these features may be used in any acoustic application where a bandpass output is desired, where low distortion is desired, where high output is desired, and/or where economically configured transducers are desired. The uses specified include, but are not limited to, bass boxes for musical instruments, permanently installed sound systems for homes or auditoria, and for nonlocalizable bass output components in multiple speaker configurations in which the desired sonic imaging is to be controlled by the higher frequency components of those multiple speaker configurations.

It is understood by the art that for any speaker system driven at high input electrical signal at a specified frequency, distortion components generated by the speaker system are generally higher in frequency than the specified frequency. If the specified frequency is in the bass region, these higher frequency distortion components make it easier for the listener to detect the speaker system location. In addition, most distortion has multiple frequency components resulting in a wideband distortion spectrum which gives multiple (positively interacting) clues to the listener as to the speaker system location. Because of the lower distortion generated by embodiments of this invention compared to prior art, these embodiments are more useful as nonlocalizable bass output components in multiple speaker configurations in which the desired sonic imaging is to be controlled by the higher frequency components of those multiple speaker configurations.

Generally speaking, it is also understood in the art that the higher order rolloff (>/=18 dB/octave) of high frequencies for the component arrangement taught by Schreiber et al., enhances its nonlocalizability. Therefore, on complex signals (music or speech), the listener will receive significant directional cues only from the higher frequency components of the speaker system. Thus, costs of component arrangements are more useful than other arrangements as nonlocalizable bass output components in multiple speaker configurations in which the desired sonic imaging is to be controlled by the higher frequency components of those multiple speaker configurations.

As noted by Schreiber et al., prior experiments indicate that a listener's ability to correctly locate sources of sounds depends on the relative time difference of the sounds coming from those sources. If spectrally identical sounds are produced by two sources spaced a few meters apart, but one source produces the sound a few milliseconds later than the other, the listener will ignore the later source and identify the earlier source as the sole producer of both sounds (Precedence Effect). Thus, component arrangements such as those taught by Schreiber et al., and those of the present invention, produce a greater time delay than prior art and thus are more useful for providing nonlocalizable bass output components in multiple speaker configurations in which the desired sonic imaging is to be controlled by the higher frequency components of those multiple speaker configurations.

SUMMARY OF THE INVENTION

The present invention pertains to a furniture application loudspeaker system preferably comprising one 12" electroacoustical transducer for converting an input signal into an acoustic output signal. The size of the transducer correlates to the size of the enclosure, which has been designed as a piece of furniture.

The enclosure for the loudspeaker system of the present application is preferably constructed of ¾" MDF dense particle board to ensure strength and durability. The enclosure must have center support walls divided semi-equally to ensure center support as well as to create a low frequency environment within the box. Also, the enclosure preferably has outside dimensions that create a rectangle that is universally adaptable in size, capable of use as an end table, a coffee table or a corner pedestal. Such universality of use as a properly sized piece of furniture is a feature not found in other remote subwoofer enclosures. In one embodiment of the invention, the enclosure will be about 26" in length, about 16" in width, and about 18½" in height, as measured externally.

DETAILED DESCRIPTION OF THE INVENTION

The present invention is directed to a furniture application loudspeaker system preferably having one 12" electroacoustical transducer for converting an input signal into an acoustic output signal. The size of the transducer correlates to the size of the enclosure, which has been designed as a piece of furniture.

In constructing the loud speaker system of the present invention the physical dimensions of the interior of the loud speaker system enclosure are deemed critical. The enclosure for the loudspeaker system of the present application is preferably constructed of ¾" MDF dense particle board to ensure strength and durability. The enclosure must have center support walls divided semi-equally to ensure center support as well as to create a low frequency environment within the box. In addition, the enclosure preferably has outside dimensions of 26" in length, 16" in width and 18½" in height. The reason for these dimensions and the uniqueness of this particular configuration lies in the fact that there is unusually good sound reproduction and that such dimensions create a "cube" that is universally adaptable in size and can be used as an end table, a coffee table or a corner pedestal. The exterior dimensions mentioned above are compatible with interior dimensions that are critical to the invention.

The enclosure of the speaker system of the present invention can optionally be provided with a glass top, said glass top preferably being constructed of beveled glass at least ⅜" thick. The glass top can be cut to size as appropriate for the furniture type application. The enclosure must have vibration absorbing supports between the glass top and the enclosure, to eliminate secondary vibrations being transmitted through the glass top itself.

Figure 1:
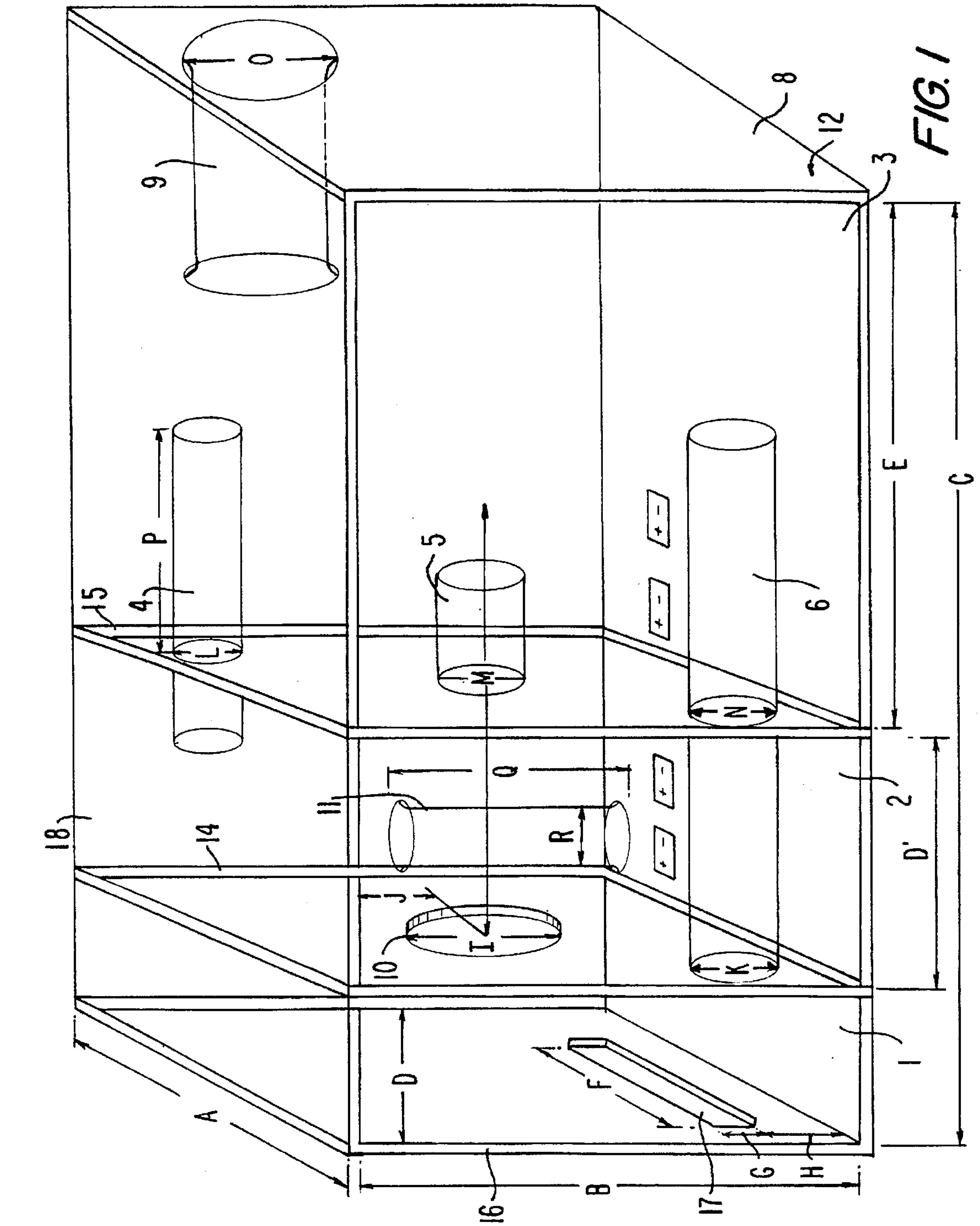
FIG. 1 is prospective pictorial representation of an embodiment of the present invention.

The inside dimensions of an enclosure according to the invention are to be configured in such a way as to create low base response at an extremely high sensitivity rate. A first dividing wall supports the 12" transducer bound to the first and second subchambers positioned, as shown in FIG. 1. A precisely tuned and positioned passive radiator intercoupling the first and third chambers is provided. The second and third chambers are intercoupled by two more precisely tuned and positioned passive radiators.

Each passive radiator is characterized by the type of frequency response desired.

Selected acoustic masses and acoustic compliances establish a precise six spaced passband for the loudspeaker system. The acoustic masses and said acoustic compliances are selected to establish at least three to six spaced frequencies in the passband of said loudspeaker system at which the deflection characteristic of said vibratable diaphragm as a function of frequency has a minimum cone excursion.

The inner walls of the enclosure are provided with acoustically absorbent material attached to the surfaces thereof.

Numerous other features, objects and advantages of the invention will become apparent from the following detailed description when read in connection with the accompanying drawings:

With reference to FIG. 1, a perspective pictorial view of a specific embodiment of the present invention is presented wherein a second dividing wall 15 separates a second internal subchamber 2 from a third subchamber 3 and carries passive radiator means 4, 5 and 6. Passive radiator 6 intercouples a first internal subchamber 1 and third subchamber 3. Third subchamber 3 has an exterior wall 8 which carries a passive radiator or port means 9 for radiating acoustic energy to the region outside the enclosure. Passive radiator 11 extends upward from lower surface 12. Preferably, one or more of the passive radiators, or port tubes, which intercouple a subchamber with the region outside the enclosure 9,11 is a port tube bounded by the inside of a toroid of elliptical cross-section. The ellipse has a major diameter substantially equal to the length of the tube.

Woofer loudspeaker driver 10 is mounted in first dividing wall 14 that separates first subchamber 1 from the second subchamber 2. The transducer is preferably a 12" driver having a useful frequency response at least the range of 25 Hz–250 Hz.

Figure 4:
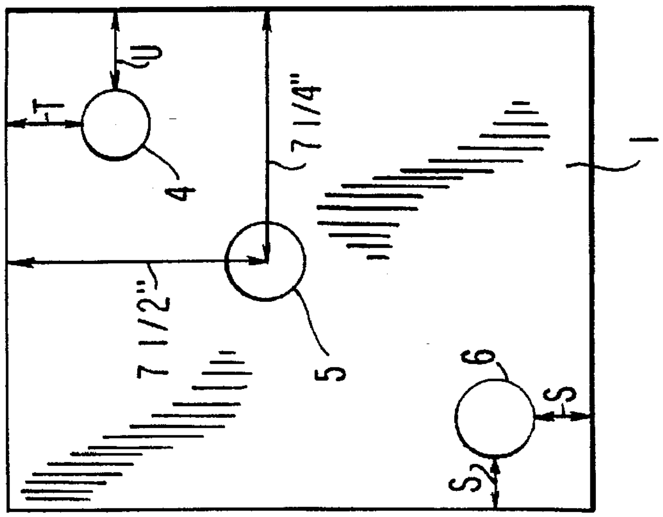
FIGS. 2, 3, and 4 are each a plan view of a wall section of the embodiment shown in FIG. 1.
Figure 3:
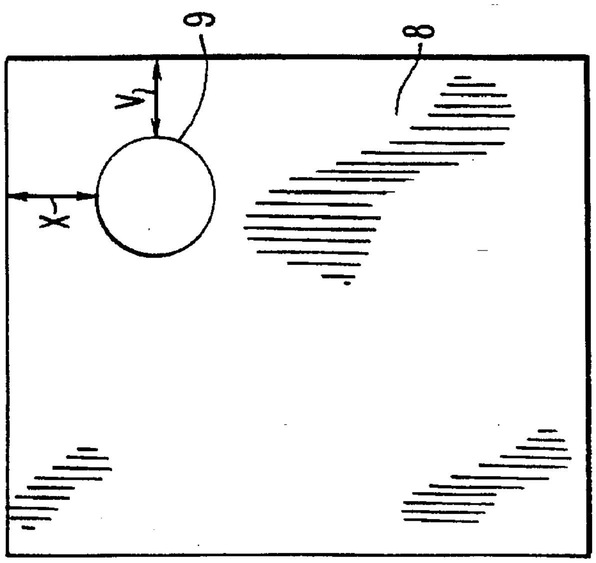
Figure 2:
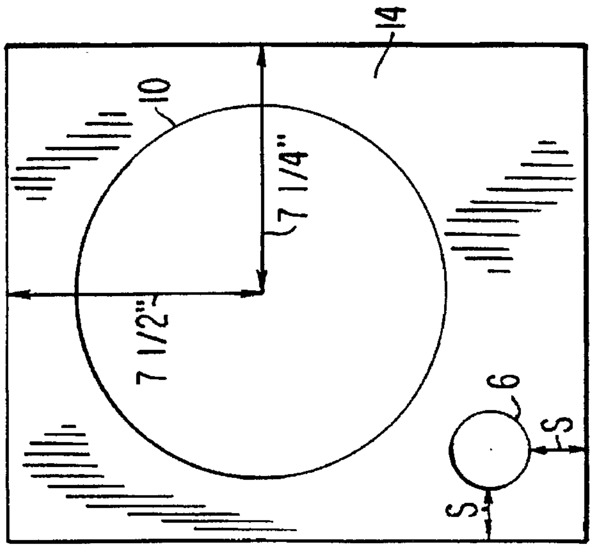

The positioning of the passive radiators and the woofer can perhaps be appreciated more in FIGS. 2, 3, and 4, which are views of dividing walls 14 and 15 and end wall 8. Opposite end wall 16 contains slotted opening 17.

In the specific embodiment depicted in FIG. 1, the various components have the following dimensions:

Passive radiator 4: Tuned Port 1½" I.D. ($1\frac{29}{32}$" O.D.)×6½"
Passive radiator 5: Tuned Port 2" I.D. (2⅜" O.D.)×2¾"
Passive radiator 6: Tuned Port 2" I.D. (2⅜" O.D.)×11½"
Passive radiator 9: Tuned Port 3" I.D. (3⅜" O.D.)×5¼"
Passive radiator 11: Tuned Port 1½" I.D. ($1\frac{29}{32}$" O.D.)×11¾"
A (Internal width): 14½"
B (Internal height): 17"
C (Overall internal length): 24½"
D (Internal length of subchamber 1): 5½"
$D^1$ (Internal length of subchamber 2): 8"
E (Internal length of subchamber 3): 9½"
F (Length of slot 17): 10" On center"
G (Width of slot 17 ): 2"
H (Distance from slot 17 to bottom 12): 1¼"
I (Diameter of opening for speaker 10): $11\frac{1}{16}$"
J (Distance from center of opening J to inner surface of top surface 18): 7½" on center
K,N (Diameter of opening for passive radiator 6): 2⅜"
L (Diameter of opening for passive radiater 4): 1⅞"
M (Diameter of opening for passive radiater 5): 2⅜"
O (Diameter of opening for passive radiater 9): 3½"
P (Length in subchamber 3 of passive radiater): 3⅛"
Q (Length in subchamber 2 of passive radiater 11): 11"
R (Diameter of opening in surface 12 for passive radiater 11): $1\frac{29}{38}$"
S: 1½"
T: 2¼"
U: 2¼"
V: 2¼"
X: 2¾"

The particular dimensions of the subchambers, the radiators, and the openings, as well as the respective relationships between these elements, are very important to the invention. It has been found that the embodiment described above represents a preferred, optimal configuration of the invention, although it is expected the minor variations may only slightly affect the quality of sound reproduction. The interior dimensions of the subchambers are particularly important, with a ¾" spacing between them. However, the outer surfaces of the enclosure could be other than ¾" thick, for example, 7 gauge or from $\frac{3}{16}$" to 1" thick, and could be of suitable rigid material, including, but not limited to, wood, aluminum or another metal, plastic, particle board, or fiberglass. The dividing walls are preferably made of a rigid material such as wood or particle board, and the passive radiators are preferably made of a rigid material such as metal or plastic. Useful plastics include commercially available polyvinylchloride polymers and co-polymers. Further, acoustically absorptive material can optionally be attached to the inner walls of one or all of the subchambers.

TESTING

Two aspects of the speaker system of the present invention, referred to hereinafter as Shulte Prototypes 1 and 2, were evaluated for performance and uniqueness of design.

Performance

Three performance parameters were considered: (1) sensitivity, (2) crossover rolloff rate, and (3) frequency response. The results of measurements reflecting these characteristics are plotted for Shulte Prototypes 1 and 2 in FIGS. 6 and 7 respectively. For comparison, the plot in FIG. 5 shows similar measurement results in connection with a commercially available passive subwoofer, the Bose Acoustimass-5, Series II, available from the Bose Corp., Boston, Mass.

In all cases, the plots show the sound power level emitted by each unit into ⅓ octave bands at the standard ISO frequencies. The RMS voltage of pink noise supplied to the subwoofer in each band is that which would provide one watt into a four ohm resistive load. Four ohms is the nominal impedance of the drivers in all cases. In this sense, the outputs plotted represent the power sensitivity to a one watt input per ⅓ octave band.

Figure 5:
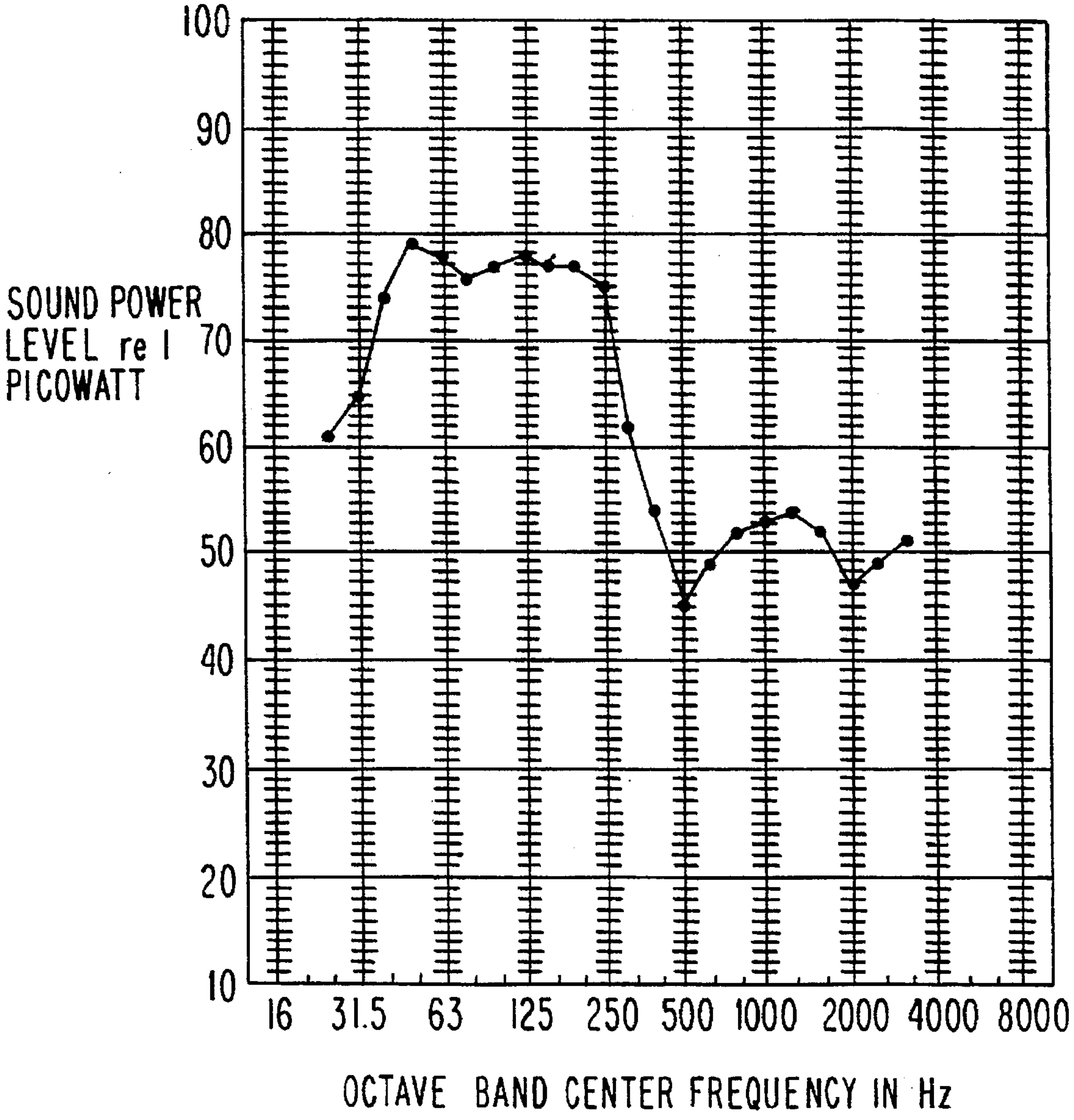
FIG. 5 PRIOR ART
FIG. 5 is a graphical representation of the frequency response of a prior art speaker, the Bose Acoustimass-5.
Figure 6:
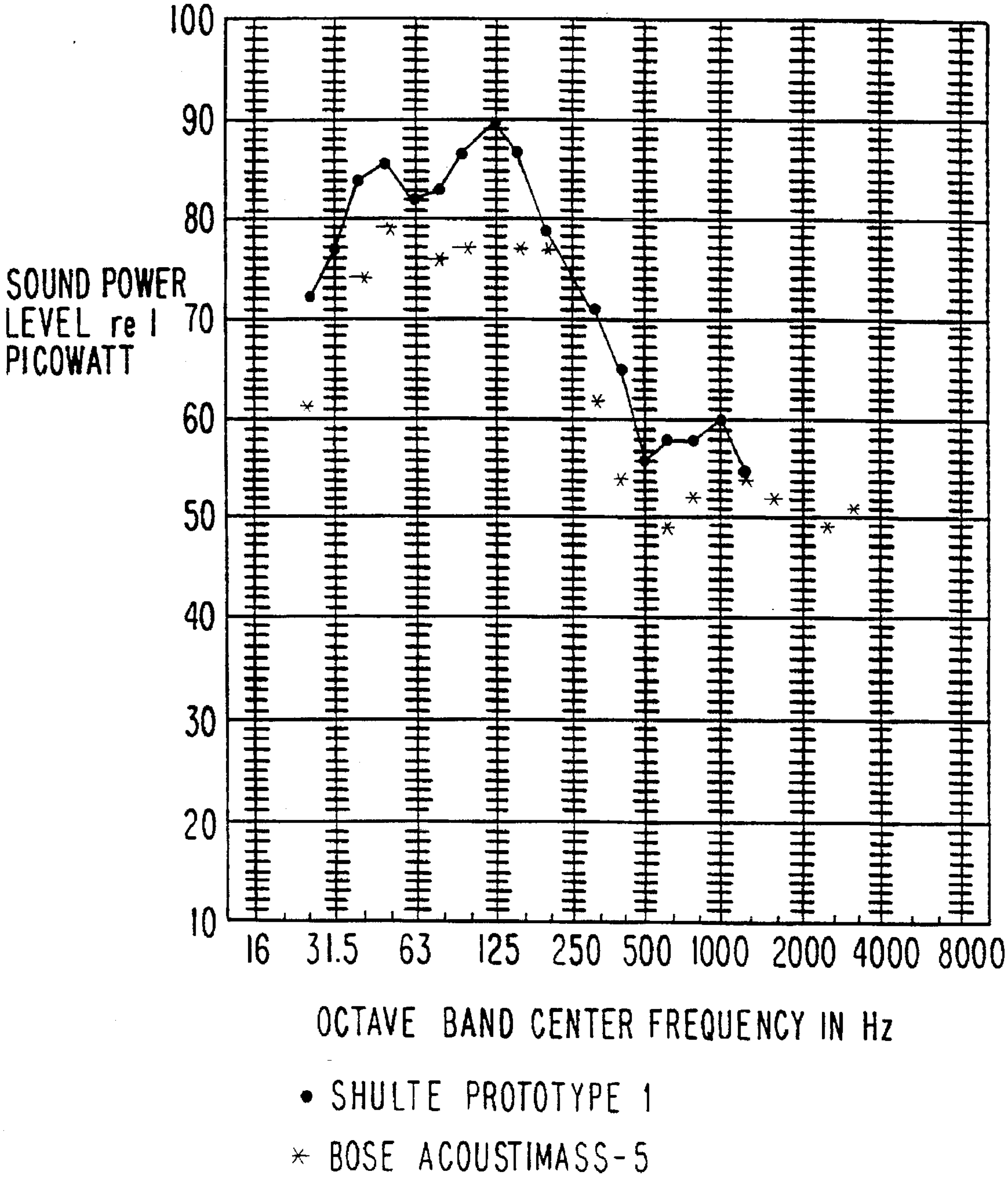
FIG. 6 is a graphic representation of the frequency response for an embodiment of the present invention as compared with the Bose Acoustimass-5.
Figure 7:
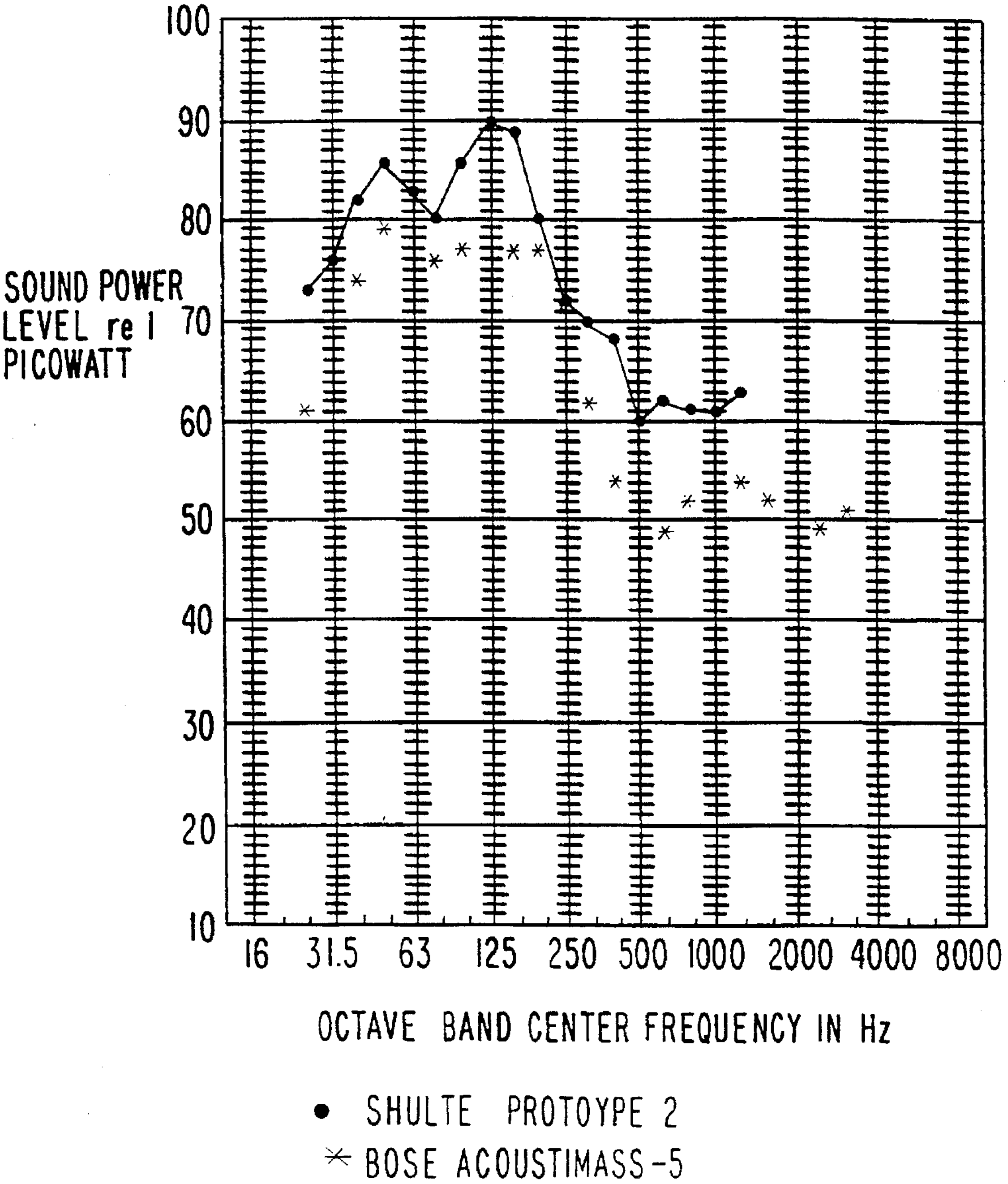
FIG. 7 is a graphic representation of another embodiment of the present invention as compared with the Bose Acoustimass-5.

Values of the performance parameters, derived from the plots, are summarized in the following table:

Although not conventionally reported, another performance feature which can be read from FIGS. 5, 6 and 7 is the residual sound power output at higher frequencies, typically in the vicinity of 100 Hz. This output should be low relative to the output in the useful subwoofer frequency range. The plots indicate that the differences between the residual high frequency outputs and the outputs in the useful subwoofer frequency ranges are similar in all cases. Therefore, in this regard, the Shulte prototypes do not perform significantly better than the Bose unit.

To summarize, the sensitivity of the Shulte prototypes was demonstrated to be significantly higher than that of the Bose Acoustimass-5 comparison unit—each of the prototypes played louder at a given input power. In addition, the frequency ranges of the prototypes are somewhat more appropriate for remote subwoofers.

The preceding specific embodiments are illustrative of the practice of the invention. It is to be understood, however, that other expedients known to those skilled in the art or disclosed herein, may be employed without departing from the spirit of the invention or the scope of the appended claims.

TABLE

PERFORMANCE OF THREE SUBWOOFER CONFIGURATIONS

| Performance | Parameter Values | | |
|---|---|---|---|
| Parameter | Acoustimass-5 | Shulte Prototype 1 | Shulte Prototype 2 |
| Average Power Sensitivity at One Watt Input [a] Per ⅓ Octave Band | 77 dB | 86 dB | 86 B |
| Crossover Rolloff Rate | 32 dB/octave [b] | 18 dB/octave | 16 dB/octave |
| Frequency Response [c] | +2, −3 40 to 250 Hz | +4, −4 40 to 160 Hz | +4, −5 40 to 200 Hz |

a. Average over ⅓ octave bands in the frequency ranges given under "frequency response"
b. Manufacturer's literature claims 36 dB/octave
c. RE: average output power The sensitivity numbers indicate that both Shulte prototypes are more efficient than the Bose unit, providing sound power output levels 9 dB higher at a one watt input. The enhanced efficiency may be due to a more efficient driver, or characteristics of the enclosure, or both. In any case, the increased efficiency would conventionally be considered an improvement over the Bose design.

The high crossover rolloff rate is also considered desirable. One of the primary motivations for the design of multichambered speaker enclosures has been that step rolloffs are inherent in the system, making electronic crossovers less essential, or even unnecessary.

Flat frequency response within the useful frequency range is conventionally considered a key goal of transducer design. If some listener preferences tend toward non-flat sound reproduction, then the desired effects are generally produced through a system equalizer, rather than loudspeaker design. The numbers in the Table indicate that the response variation of the Bose unit is roughly half of the response variations measured for the two Shulte prototypes.

The frequency response row of the Table also indicates that the outputs of the Shulte prototypes are concentrated at somewhat lower frequencies than is the output of the Bose unit. This suggests that the prototypes are more suited to the role of the remote subwoofer component in sound reproduction systems. The response of the Bose unit at higher frequencies could make the location of the remote unit more perceptible. Such localizability is not considered desirable.

I claim:

1. A nonlocalizable loudspeaker system which produces spectrally identical sounds spaced apart, comprising:

a first electroacoustical transducer having a vibratable diaphragm for converting an input electrical signal into a corresponding acoustic output signal, said diaphragm having a deflection characteristic;

an enclosure, said enclosure containing a first and a second dividing wall, and being divided into first, second and third subchambers by said first and second dividing walls;

said first dividing wall supporting and coacting with said first electroacoustical transducer to bound said first and said second subchambers;

a first internal passive radiator intercoupling said first and third subchambers;

a second internal passive radiator intercoupling said second and third subchambers, wherein said radiator is a port tube and said port tube extends at least partially into both the second and third subchambers;

first and second additional passive radiators intercoupling two of the first, second and third subchambers with the region outside said enclosure, each of said additional passive radiators characterized by acoustic mass and each of said subchambers characterized by acoustic compliance, wherein said first additional passive radiator intercouples a subchamber from a direction 90° from the direction of the second additional passive radiator, wherein said acoustic masses and said acoustic compliances are selected to establish from five to six spaced frequencies in the passband of said loudspeaker system at which the deflection characteristic of said vibratable diaphragm as a function of frequency has a minimum value, and wherein said enclosure is substantially rectangular and is a unit of furniture.

2. A loudspeaker system in accordance with claim 1 and further comprising a third internal passive radiator intercoupling said second and third subchambers.

3. A loudspeaker system in accordance with claim 1, wherein said first and third chambers are end subchambers.

4. A loudspeaker system in accordance with claim 2, wherein said first internal passive radiator passes through said second subchamber.

5. A loudspeaker system in accordance with claim 1, wherein the transducer is a 12" driver having a useful frequency response in at least the range of 25 Hz–250 Hz.

6. A loudspeaker system in accordance with claim 5, wherein said at least one of said first and second additional passive radiators is a port tube bounded by the inside surface of a toroid substantially elliptical cross section.

7. A loudspeaker system in accordance with claim 6, wherein said elliptical cross section has a major diameter corresponding substantially to the length of said port tube.

8. A loudspeaker system in accordance with claim 1, wherein said at least one of said additional passive radiators intercouples said second subchamber with the region outside said enclosure, and further comprising at least one internal passive radiator intercoupling adjacent subchambers.

9. A loudspeaker system in accordance with claim 1, wherein the enclosure has an external overall dimensions, wherein said external overall dimensions of the enclosure are 26" in length, 16" in width and 18½" in height.

10. A loudspeaker system in accordance with claim 1, wherein the first subchamber has internal dimensions of 17"×14½"×5½, the second subchamber has internal dimensions of 17"×14½"×8", and the third subchamber has internal dimensions of 17"×14½"×9½".

11. A loudspeaker system in accordance with claim 1, wherein one subchamber is intercoupled with the region outside the enclosure by a slotted opening.

* * * * *